United States Patent [19]

Mentzer

[11] Patent Number: 5,821,824
[45] Date of Patent: Oct. 13, 1998

[54] MULTISTAGE VOLTAGE CONVERTER FOR VOLTAGE CONTROLLED OSCILLATOR

[75] Inventor: Ray Alan Mentzer, Corvallis, Oreg.

[73] Assignee: National Semiconductor Corporation, Santa Clara, Calif.

[21] Appl. No.: 920,186

[22] Filed: Aug. 25, 1997

[51] Int. Cl.$^6$ .............................. H03B 5/24; H03B 5/04; H03L 1/00; H03F 3/45

[52] U.S. Cl. .............................. 331/57; 331/34; 331/175; 331/177 R; 331/185; 327/52; 327/100; 330/295

[58] Field of Search ...................... 331/34, 57, 116 FE, 331/175, 177 R, 185; 327/52, 100, 103; 330/69, 252–254, 261, 295, 124 R, 124 D

[56] References Cited

U.S. PATENT DOCUMENTS 5,079,515  1/1992  Tanimoto ........................... 330/256

*Primary Examiner*—David Mis
*Attorney, Agent, or Firm*—Limbach & Limbach L.L.P.

[57] ABSTRACT

A multistage voltage-to-current ("VI") converter for producing, in response to an input voltage, an output voltage useful for controlling a voltage-controlled oscillator ("VCO"). Preferably, the transfer function of the VI converter is such that the output clock frequency-to-input voltage transfer function (of a system including the VI converter and the VCO) is at least approximately linear over a desired output clock frequency range and has a desired slope in such range. In preferred embodiments, the multistage VI converter includes three differential amplifier stages connected in parallel. Each stage has a tail current and receives a reference voltage (the tail currents and reference voltages typically differ from stage to stage), and produces a component of a total current. The total current determines the output voltage. Optionally, bias circuitry is provided for producing nonzero output voltage in response to zero input voltage. In other embodiments, the multistage VI converter includes two stages or more than three stages connected in parallel, each stage producing a component of a total current which determines the output voltage. The number of stages, and the tail current and reference voltage (and resistor values and transistor characteristics) of each stage, are chosen to achieve a desired output voltage-to-input voltage transfer function. Another aspect of the invention is a VCO system including any embodiment of the multistage VI converter of the invention.

25 Claims, 5 Drawing Sheets

MULTISTAGE VOLTAGE CONVERTER FOR VOLTAGE CONTROLLED OSCILLATOR

BACKGROUND OF THE INVENTION

1. Field of the Invention

The invention pertains to voltage conversion circuits for producing (in response to an input voltage) an output voltage useful for controlling a voltage-controlled oscillator ("VCO"). In preferred embodiments, the invention is a multistage voltage converter for producing (in response to an input voltage) an output voltage for controlling a VCO such that the "output clock frequency-to-input voltage" transfer function of the system comprising the converter and the VCO is at least substantially linear over an adequate frequency range and has a desired average slope in such range.

2. Description of the Related Art

It is well known to implement voltage conversion using a differential amplifier circuit having the structure shown in FIG. 1. The FIG. 1 circuit asserts output voltage "OUT" (at node B) in response to input voltage "Vin." Since the voltage "OUT" is determined by the current I2 flowing through the channel of transistor Q2 (and fixed characteristics of components of the FIG. 1 circuit), the FIG. 1 circuit will sometimes be referred to as a voltage-to-current converter ("VI" converter). The FIG. 1 circuit will alternatively be referred to as a voltage converter.

The FIG. 1 circuit comprises P-channel MOSFET ("PMOS") transistors Q1 and Q2 and N-channel MOSFET ("NMOS") transistors Q3, Q4, and Q5, and is typically implemented as an integrated circuit (or portion of an integrated circuit). Transistor Q5, whose channel terminals are connected between node A and ground as shown and whose gate is held at control voltage V5, is a current source which sinks current I5 from node A.

Each of transistors Q1 and Q2 has its gate connected to its drain. Supply voltage Vdd is asserted to the source of each of Q1 and Q2, the drain of transistor Q3 is connected to the drain of Q1, and the drain of transistor Q4 is connected to the drain of Q2. Transistors Q3 and Q4 comprise a differential pair, resistor R1 is connected between node A and the source of Q3, and resistor R2 is connected between node A and the source of Q4. Reference voltage REF0 is asserted to the gate of Q3. Input voltage Vin is asserted to the gate of Q4.

The current through the channels of Q1 and Q3 is "I1" and the current through the channels of Q2 and Q4 is "I2". As input voltage "Vin" (the gate voltage of transistor Q4) rises above the threshold voltage of Q4, current I2 initially increases and current I1 initially decreases (while I5=I2+I1, the total current sunk to ground by Q5, remains constant). When Vin rises up to (and above) a second voltage V2, current I1 has decreased to zero and I2 is equal to I5. The "second voltage" V2 is equal to REF0+I5R2, assuming transistors Q3 and Q4 have identical gate-to-source voltages during operation.

The useful operating range ("transition region") of the FIG. 1 circuit is the range in which Vin is greater than the threshold voltage ($V_{th}$) of Q4 and less than the "second voltage" V2, in which range both I1 and I2 are nonzero. When R1 and R2 are zero or negligibly small, the transition region of the FIG. 1 circuit is very narrow (typically on the order of a hundred millivolts), and typically too narrow to be useful. By selecting appropriate non-zero resistance values of resistors R1 and R2 (e.g., R1=R2=3000 ohms, as indicated in FIG. 1), the width of the transition region is broadened to have a useful value of 2 (REF0–$V_{th}$) or (Vdd–$V_{th}$), whichever is less. In typical implementations of the FIG. 1 circuit, the transition region has a width of between 2 and 3 volts.

Reference voltage REF0 applied to the gate of transistor Q3 is preferably chosen so that the FIG. 1 circuit is balanced, in the sense that it operates at the midpoint of the transition range (where I2=I1) when Vin=REF0. For this reason, REF0 is preferably equal to about Vdd/2, and in a preferred implementation of the FIG. 1 circuit in which Vdd is 3.3 volts (produced, for example, by stepping down a 5 volt external voltage to 3.3 volts using circuitry not shown), REF0 is chosen to be 1.65 volts, and the midpoint of the Vin's transition range is 1.65 volts.

However, the conventional VI converter of FIG. 1 is subject to the following problem when used in a system in which its output voltage controls a VCO. Such system has an "output clock frequency-to-input voltage" transfer function which relates the input voltage (asserted to the VI converter) to the frequency of the clock asserted at the VCO output in response to the input voltage. For typical implementations of such system, the output clock frequency-to-input voltage transfer function is undesirably flat (i.e. has very low slope, approaching zero) at high output frequencies in the desired output clock frequency range (as does curve E of FIG. 4, to be discussed below), at least where the desired output clock frequency range is broad (e.g., on the order of 100 MHz or more). It would be desirable to implement a VI converter whose output voltage-to-input voltage transfer function is such that a VCO system (in which the VI converter is used) is not subject to this saturating response effect (e.g., so that the output clock frequency-to-input voltage transfer function is linearly increasing or substantially linearly increasing at all desired output frequencies). However, until the present invention it was not known how to design a VI converter to eliminate the saturating response problem.

It would also be desirable to implement a VCO (including a VI circuit having a predetermined design) which can attain a desired maximum output clock frequency (given a particular range of values of input voltage) despite changes in process and operating temperature conditions. However, until the present invention it was not known how to design such a VCO system.

It would also be desirable to implement a class of VI converters (differing from each other by having different values of a small number of circuit parameters) so that a VI converter having any selected one of a variety of output voltage-to-input voltage transfer functions can be selected from the class. However, until the present invention it was not known how to implement such a class of VI converters (which class is characterized by a generic design having many degrees of freedom).

SUMMARY OF THE INVENTION

One aspect of the invention is a multistage voltage-to-current converter (multistage "VI" converter) for producing (in response to an input voltage) an output voltage useful for controlling a VCO. Preferably, the transfer function of the VI converter is such that the "output clock frequency-to-input voltage" transfer function (of a system including the VI converter and the VCO) is at least substantially linear over a desired output clock frequency range and has a desired average slope in such range. In preferred embodiments, the multistage VI converter includes three stages connected in parallel. Each stage is a differential amplifier, having a tail current and receiving a reference voltage (the tail currents and reference voltages typically differ from stage to stage), which produces a component of a total current. The total current determines the output voltage. Optionally also, bias circuitry is provided for producing nonzero output voltage in response to zero input voltage.

In alternative embodiments, the multistage VI converter includes two stages or more than three stages connected in parallel, each stage being a differential amplifier producing a component of a total current which determines the output voltage. The number of stages, and the tail current and reference voltage (and resistor values and transistor characteristics) of each stage, are chosen to achieve a desired "output voltage-to-input voltage" transfer function.

Another aspect of the invention is a voltage-controlled oscillator ("VCO") system including any of the embodiments of the inventive multistage VI converter.

DETAILED DESCRIPTION OF PREFERRED EMBODIMENTS

Figure 1:
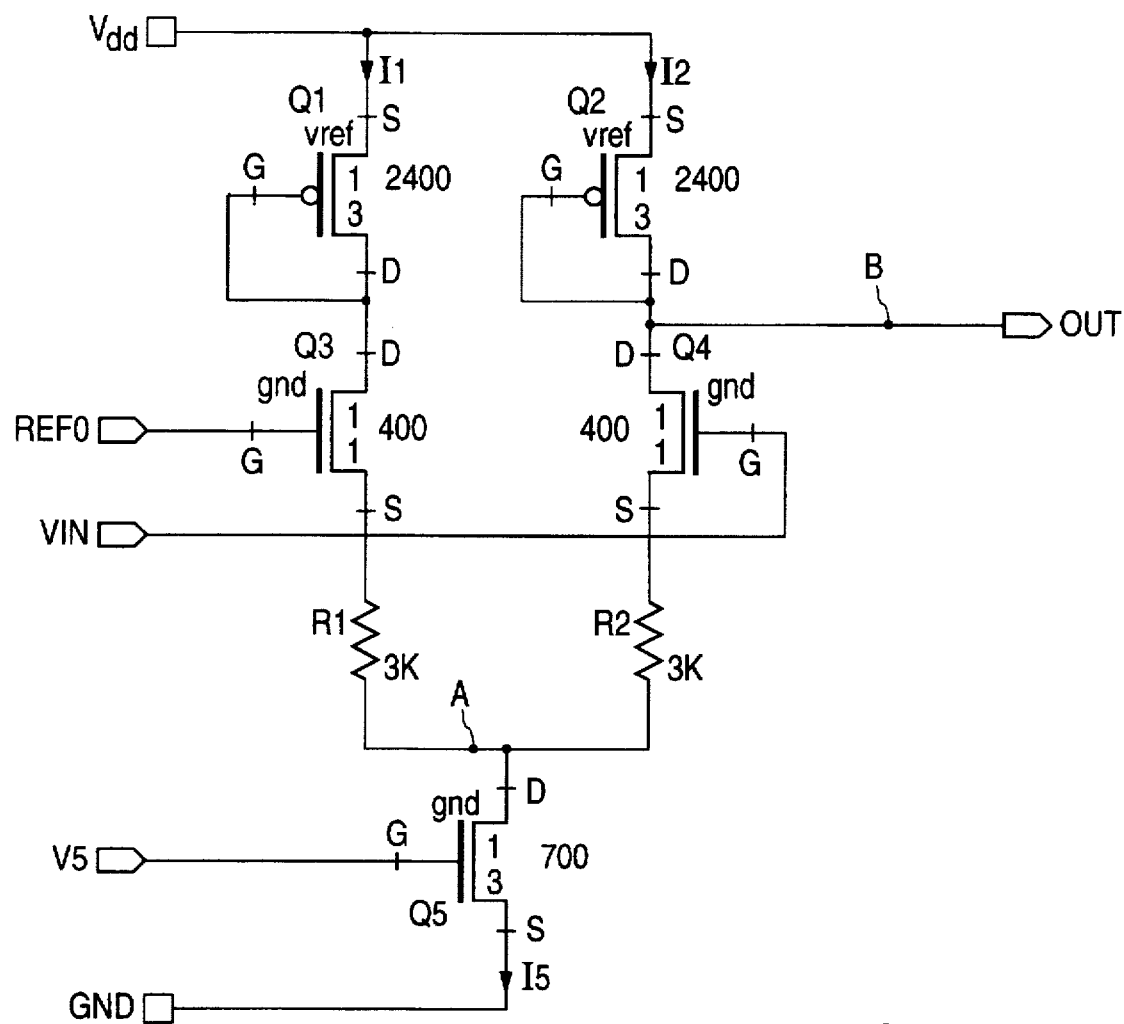
FIG. 1 is a schematic diagram of a conventional voltage-to-current ("VI") converter.
Figure 2:
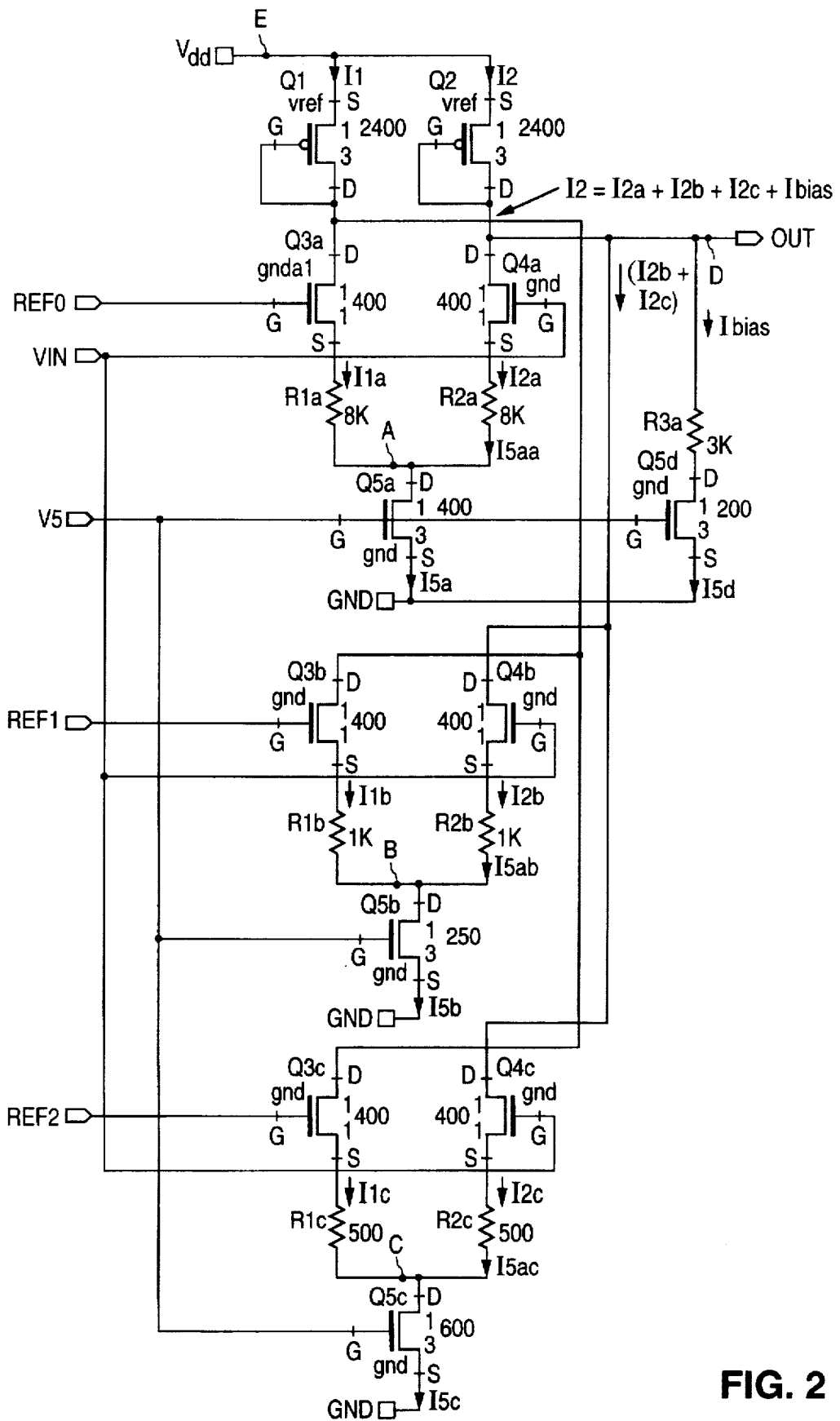
FIG. 2 is a schematic diagram of a preferred embodiment of the multistage voltage-to-current converter of the invention.

The circuit of FIG. 2 is a preferred embodiment of the multistage VI converter of the invention. The multistage VI converter of the invention will sometimes be referred to herein as a "multistage voltage converter." The FIG. 2 circuit includes the following three stages, each stage being a differential amplifier having the form of the differential amplifier of FIG. 1:

a first stage comprising NMOS transistors Q3a and Q4a, resistors R1a and R2a, and NMOS transistor Q5a (whose channel terminals are connected between node A and ground as shown and whose gate is held at control voltage V5, and which functions as a current source which sinks current I5a from node A to ground);

a second stage comprising NMOS transistors Q3b and Q4b, resistors R1b and R2b, and NMOS transistor Q5b (whose channel terminals are connected between node B and ground as shown and whose gate is held at control voltage V5, and which functions as a current source which sinks current I5b from node B to ground); and a third stage comprising NMOS transistors Q3c and Q4c, resistors R1c and R2c, and NMOS transistor Q5c (whose channel terminals are connected between node C and ground as shown and whose gate is held at control voltage V5, and which functions as a current source which sinks current I5c from node C to ground).

The FIG. 2 circuit is typically implemented as an integrated circuit (or portion of an integrated circuit).

The FIG. 2 circuit also comprises PMOS transistors Q1 and Q2, each having its gate connected to its drain. Supply voltage Vdd is asserted to the source of each of Q1 and Q2. The current through the channel of transistor Q1 is denoted as I1, and the current through the channel of transistor Q2 is denoted as I2.

The FIG. 2 circuit asserts output voltage "OUT" (at node D) in response to input voltage "Vin". The voltage "OUT" is determined by the current I2 flowing through the channel of transistor Q2 (and of course by fixed characteristics of components of the FIG. 2 circuit). The current I2 is the sum of the following four currents: I2a (the current through the channel of transistor Q4a); I2b (the current through the channel of transistor Q4b); I2c (the current through the channel of transistor Q4c); and Ibias (the current through the channel of transistor Q5d).

In the first stage, the drain of transistor Q3a is connected to the drain of Q1, and the drain of transistor Q4a is connected to the drain of Q2. Transistors Q3a and Q4a comprise a differential pair, resistor R1a is connected between node A and the source of Q3a, and resistor R2a is connected between node A and the source of Q4a. Reference voltage REF0 is asserted to the gate of Q3a. Input voltage Vin is asserted to the gate of Q4a. As input voltage Vin rises above the threshold voltage of Q4a, current I2a (the current through the channel of transistor Q4a) begins to increase and current I1a (the current through the channel of transistor Q3a) begins to decrease (while I5a=I2a+I1a, the total current sunk to ground by Q5a, remains constant). When Vin rises up to and above a second voltage V2, current I1a has decreased to zero, and I2a has risen to equal I5a. The "second voltage" V2 is equal to REF0+(I5a)(R2a), assuming transistors Q3a and Q4a have identical gate-to-source voltages ($V_{gs}$).

In general, the threshold voltage ($V_{th}$) of each of transistors Q3a, Q4a, Q3b, Q4b, Q3c, and Q4c is a function of process and the amount of current flowing in the device. At fast-corner, $V_{th}$ is typically 0.4 Volts; at slow-corner, $V_{th}$ is typically about 1.0 Volt. In a typical implementation of the FIG. 2 circuit, when Vin has risen from ground potential to transistor Q4's threshold voltage (so that transistor Q4 begins to pass current) the value of $V_{gs}$ for transistor Q4 is about 800 mV, and when Vin has risen to V2a (so that transistor I2a=I5a and I1a=0), the value of $V_{gs}$ for transistor Q4 is about 1.2 Volts.

In the second stage, the drain of transistor Q3b is connected to the drain of Q1, and the drain of transistor Q4b is connected to the drain of Q2. Transistors Q3b and Q4b comprise a differential pair, resistor R1b is connected between node B and the source of Q3b, and resistor R2b is connected between node B and the source of Q4b. Reference voltage REF1 is asserted to the gate of Q3b. Input voltage Vin is asserted to the gate of Q4b. As input voltage Vin rises above the threshold voltage of Q4b, current I2b (the current through the channel of transistor Q4b) initially increases and current I1b (the current through the channel of transistor Q3b) initially decreases (while I5b=I2b+I1b, the total current sunk to ground by Q5b, remains constant). When Vin rises up to and above a third voltage V3, current I1b has decreased to zero, and I2b has risen to equal I5b. The "third voltage" V3 is equal to REF1+(I5b)(R2b), assuming transistors Q3b and Q4b have identical gate-to-source voltages ($V_{gs}$).

In the third stage, the drain of transistor Q3c is connected to the drain of Q1, and the drain of transistor Q4c is connected to the drain of Q2. Transistors Q3c and Q4c comprise a differential pair, resistor R1c is connected between node C and the source of Q3c, and resistor R2c is connected between node C and the source of Q4c. Reference voltage REF2 is asserted to the gate of Q3c. Input voltage Vin is asserted to the gate of Q4c. As input voltage Vin rises above the threshold voltage of Q4c, current I2c (the current through the channel of transistor Q4c) initially increases and current I1c (the current through the channel of transistor Q3c) initially decreases (while I5c=I2c+I1c, the total current sunk to ground by Q5c, remains constant). When Vin rises up to (and above) a fourth voltage V4, current I1c has decreased to zero, and I2c has risen to equal I5c. The "fourth voltage" V4 is equal to REF2+(I5c)(R2c), assuming transistors Q3c and Q4c have identical gate-to-source voltages ($V_{gs}$).

The useful operating range of the FIG. 2 circuit is the range in which Vin is less than the largest of the above-mentioned second voltage, third voltage, and fourth voltage (and in which Vin is greater than $V_{th}$, the lowest of the threshold voltages of Q4a, Q4b, and Q4c). By selecting appropriate resistance values of resistors R1a, R2a, R1b, R2b, R1c, and R2c, this useful operating range is from $V_{th}$ to Vdd.

In order to achieve a desired "output voltage-to-input voltage" (OUT-to-Vin) transfer function and a corresponding desired "current I2-to-input voltage" transfer function, the characteristics of the components of the FIG. 2 circuit (e.g., the values of resistors R1a–R1c and R2a–R2c, and the channel characteristics of transistors Q5a, Q5b, and Q5c) and the levels of reference voltages REF0, REF1, and REF2, are chosen so that current I2 has a desired dependence on input voltage Vin in the operating range. In general, the tail current of each stage (e.g., the current sunk by transistor Q5a, Q5b, or Q5c), the level of each stage's reference voltage (e.g., reference voltage REF0, REF1, or REF2), and the resistor values of each stage (e.g., the resistance of R2a, R2B, or R2c) will differ from stage to stage.

The first stage has a "first" transition range in which current I2a is greater than zero and less than I5a, the second stage has a "second" transition range in which current I2b is greater than zero and less than I5b, and the third stage has a "third" transition range in which current I2c is greater than zero and less than I5c.

In the particular implementation shown in FIG. 2, R1a=R2a=8000 ohms, R1b=R2b=1000 ohms, R1c=R2c=500 ohms, transistors Q3a, Q4a, Q3b, Q4b, Q3c, and Q4c have identical characteristics (e.g., channel width to length ratios), Vdd is 3.3 volts, REF0=Vdd/2, REF1=(¾)Vdd, and REF2=Vdd. In this implementation, I5a is about 200 microamps, and I5c is about 300 microamps. By choosing R1a=R2a to be sixteen times greater than R1c=R2c, and R1b=R2b to be twice R1c=R2c, the first transition range is larger than the second transition range (the first transition range is larger by a factor of about 10.7 than the third transition range), and the second transition range is larger (by a factor of about 4.8) than the third transition range. Thus, current I2a varies with Vin over a larger portion of the operating range of the FIG. 2 circuit than the portion over which I2b varies with Vin, and current I2b varies with Vin over a larger portion of the operating range of the FIG. 2 circuit than the portion over which I2c varies with Vin. In an implementation in which I5a=I5b=I5c (a variation on the particular implementation shown in FIG. 2), the first transition range can be about sixteen times wider than the third transition range, and the second transition range can be about twice as wide as the third transition range.

In the particular implementation shown in FIG. 2 (discussed in the previous paragraph), the function of the second stage is to increase the slope of the "output voltage-to-input voltage" transfer function of the FIG. 2 circuit in the upper portion of the operating range (the portion over which high values of input voltage Vin are asserted), and the function of the third stage is to increase further the slope of the "output voltage-to-input voltage" transfer function of the FIG. 2 circuit in the upper portion of such upper portion of the operating range. This result from choosing reference voltage REF2 to be greater than REF1 and reference voltage REF1 to be greater than REF0. Reference voltage REF0 is preferably chosen to be Vdd/2 so that the FIG. 2 circuit is balanced, in the sense that the first stage operates at the midpoint of its transition range (at which I2a I1a) when Vin REF0=Vdd/2.

Figure 3:
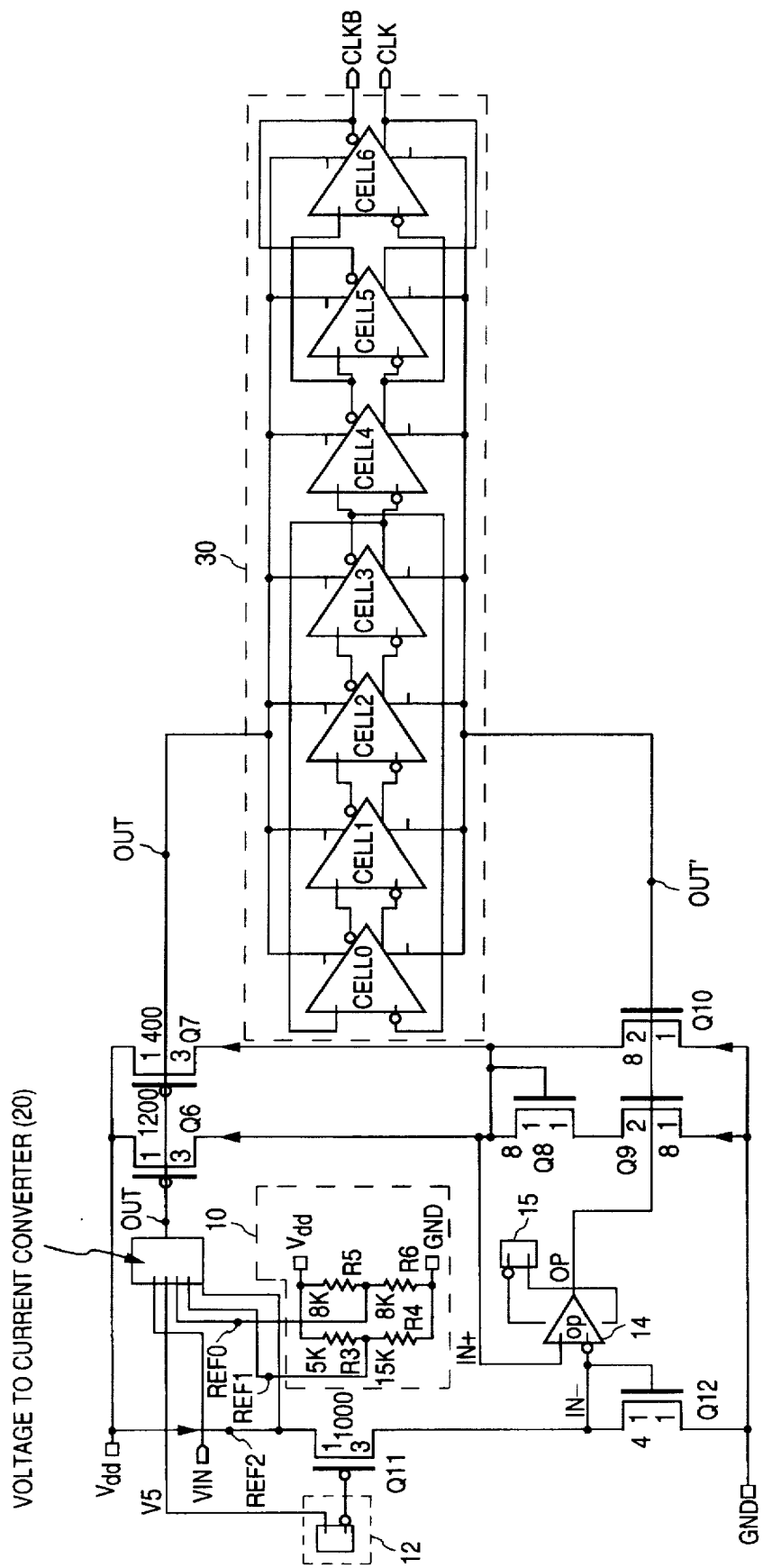
FIG. 3 is a schematic diagram of a voltage controlled oscillator circuit which can be implemented as an integrated circuit (or a portion of an integrated circuit) and which includes the FIG. 2 embodiment of the invention.

In the preferred implementation of the inventive VI converter (shown in FIG. 2) and in variations thereon for use in a VCO system such as the FIG. 3 system, each of reference voltages REF0, REF1 and REF2 should be greater than or equal to Vdd/2, so that the VI converter corrects for (and reduces or eliminates) the above-mentioned saturating response effect (flattened "output clock frequency-to-input voltage" transfer function of the VCO system in the upper portion of the input voltage range) to which the VCO system would otherwise be subject (i.e., if a conventional VI converter were substituted for the inventive VI converter).

With reference again to FIG. 2, the function of transistor Q5d is to provide a bias (nonzero) value of output voltage "OUT" in response to input voltage Vin having the value zero (or a value less than the lowest threshold voltage of transistors Q4a, Q4b, and Q4c). This "zero input voltage" bias value of voltage "OUT" is achieved by choosing voltage V5 (asserted to the gate of Q5d) to be greater than the threshold voltage of Q5d so that current "Ibias" through resistor R3a (and the channel of Q5d connected in series therewith) is nonzero. When input voltage Vin is above the lowest threshold voltage of Q4a, Q4b, and Q4c, "Ibias" varies (by small amounts) in response to changes in Vin, since the voltage at output node D varies in response to changes in currents I2a, I2b, and I2c (which in turn occur in response to changes in Vin).

In alternative embodiments in which a nonzero "zero input voltage" bias value of voltage "OUT" is not needed, elements Q5d and R3a are omitted, and as a result an output voltage OUT of zero volts (below Vdd) is asserted in response to zero input voltage Vin. In such alternative embodiments, some or all of the values of R1a, R2a, R1b, R2b, R1c, and R2c and the characteristics of transistors Q3a, Q4a, Q3b, Q4b, Q3c, Q4c, Q5a, Q5b, and Q5c can be changed (from the values shown in FIG. 2) to achieve a desired output voltage to input voltage transfer function.

In the FIG. 2 circuit, current "I2" is determined by the relation: I2=I2a+I2b+I2c+Ibias. Component current I2a is related to the input voltage (Vin) by a nondecreasing function of the input voltage, component current I2b is related to the input voltage by a second nondecreasing function of said input voltage, and component current I2c is related to the input voltage by a third nondecreasing function of said input voltage. Output voltage "OUT" is related to the sum of the component currents (I2a+I2b+I2c) by a fourth nondecreasing function of such sum of the three component currents. The "fourth nondecreasing function" can be expressed as a function of the component current sum (I2a+I2b+I2c) and the bias current (Ibias). The bias current "Ibias" is (to a first order approximation) constant and independent of Vin. The fourth nondecreasing function is a nondecreasing function of the component current sum. Output voltage "OUT" is also related to input voltage "Vin" by a fifth nondecreasing (and nonlinear) function of such input voltage. Examples of the "fourth nondecreasing function" are the functions graphed as curves "A"and "B" in FIG. 4.

In alternative embodiments of the inventive VI convert in which there are two differential amplifier stages or more than three differential amplifier stages (rather than three such stages as in the FIG. 2 embodiment), each stage draws a component current at the output node. The output voltage is related to the sum of the component currents by a nondecreasing function of such component current sum. The output voltage is related to the input voltage ("Vin") by another nondecreasing (and nonlinear) function of such input voltage.

Figure 5:
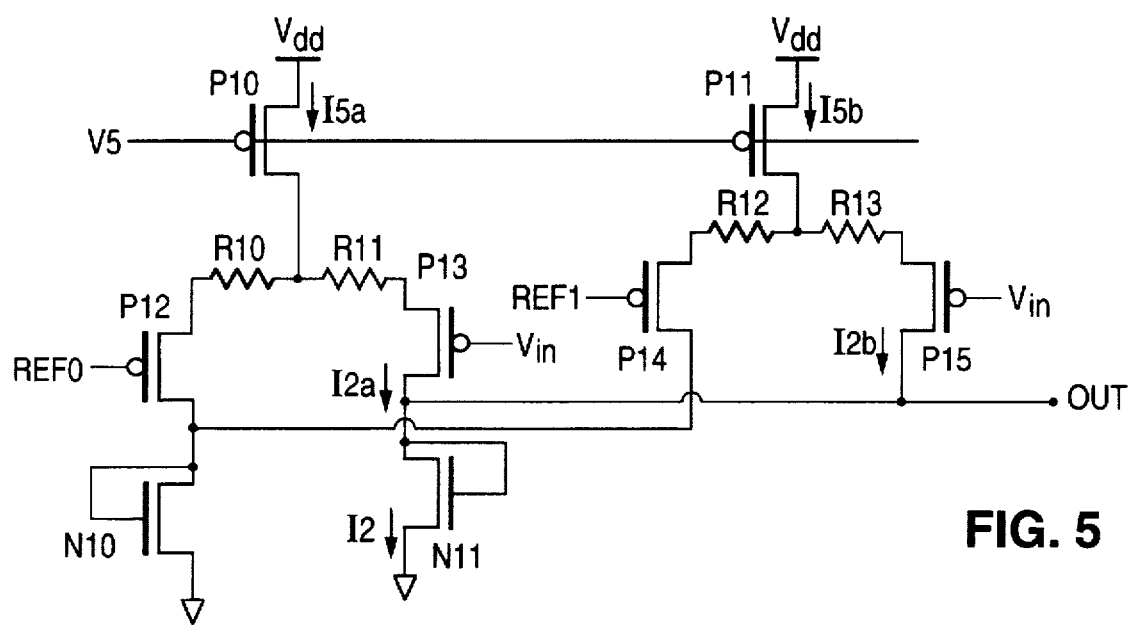
FIG. 5 is a schematic diagram of a portion (two stages) of an alternative embodiment of the multistage voltage-to-current converter of the invention.

In other embodiments of the inventive multistage VI converter, each of the parallel-connected differential amplifier stages draws a component current at the output node, the output voltage is related to the sum of the component currents by a nonincreasing function of such component current sum, and the output voltage is also related to the input voltage ("Vin") by another nonincreasing (and nonlinear) function of such input voltage. An example of such embodiment is a variation on the FIG. 2 circuit (to be described with reference to FIG. 5) in which transistors Q3 and Q4 are replaced by PMOS transistors. As shown in FIG. 5, each of NMOS transistors N10 and N11 has its gate connected to its drain. Supply voltage Vdd is asserted to the source of each of PMOS transistors P10 and P11, and transistors P10 and P11 are biased by voltage V5 asserted to their gates. In the first stage, the source of PMOS transistor P12 is connected (through resistor R10) to the drain of P10, the source of PMOS transistor P13 is connected (through resistor R11) to the drain of transistor P10, and the drains of P12 and P13 are connected respectively to the drains of transistors N10 and N11. Transistors P12 and P13 comprise a differential pair. Reference voltage REF0 is asserted to the gate of P12. Input voltage Vin is asserted to the gate of P13. The current through the channel of P13 is "I2a". As input voltage "Vin" falls below Vdd by the threshold voltage of P13, current I2a initially increases (and the current through the channel of P12 initially decreases) while I5a (the total current sourced through P10) remains constant. When Vin falls below a second voltage, the current through P12 has decreased to zero and I2a is equal to I5a.

In the second stage of the FIG. 5 circuit, the source of PMOS transistor P14 is connected (through resistor R12) to the drain of P11, the source of PMOS transistor P15 is connected (through resistor R13) to the drain of transistor P10, and the drains of P14 and P15 are connected respectively to the drains of transistors N10 and N11. Transistors P14 and P15 comprise a differential pair. Reference voltage REF1 is asserted to the gate of P14. Input voltage Vin is asserted to the gate of P15. The current through the channel of P15 is "I2b." As input voltage "Vin" falls below Vdd by the threshold voltage of P15, current I2b initially increases (and the current through the channel of P14 initially decreases) while I5b (the total current sourced through P11) remains constant. When Vin falls below a third voltage, the current through P14 has decreased to zero and I2b is equal to I5b. The output voltage "OUT" is determined by current I2 (through the channel of N11). Current I2 is the sum of component currents I2a, I2b, and any similarly generated component currents from each of any additional stages (not shown).

More generally, in other embodiments of the inventive multistage VI converter each of the parallel-connected differential amplifier stages draws a component current at the output node, the output voltage is related to the sum of the component currents by a nonlinear function of such component current sum, and the output voltage is also related to the input voltage by another nonlinear function of such input voltage.

The multistage structure of the inventive VI converter allows it to assert a VI output voltage (and a corresponding current, such as current I2) which varies nonlinearly with input voltage (typically faster than linearly over at least the upper part of the operating range, or the lower part of such range in the FIG. 5 embodiment). This nonlinear variation can cancel nonlinearities in the response of a VCO to the VI output voltage, thereby providing a linear (or substantially linear) overall transfer function for the VCO (i.e., a linear or substantially linear "output clock frequency-to-input voltage" transfer function for the VCO).

In alternative embodiments, the multistage VI converter of the invention includes two stages or more than three stages connected in parallel, each stage being a differential amplifier producing a component of a total current which determines the output voltage. The number of stages, and the tail current and reference voltage (and resistor values and transistor characteristics) of each stage, are chosen to achieve a desired "VI output voltage-to-input voltage" transfer function, typically a nonlinear VI output voltage-to-input voltage transfer function designed to cancel out nonlinearities in the response of a VCO to the output voltage asserted by the VI converter.

Another aspect of the invention is a voltage-controlled oscillator ("VCO") system including any of the embodiments of the inventive multistage VI converter. The circuit shown in FIG. 3 is such a VCO system. More specifically, the FIG. 3 circuit is a differential voltage-controlled oscillator which has conventional design except in the following respects:

the FIG. 2 circuit (rather than a conventional circuit such as that shown in FIG. 1) implements voltage-to-current converter 20; and in the FIG. 3 circuit, resistor circuit 10 provides reference voltages REF0 and REF1 to the first and second three stages of VI converter 20, and supply voltage Vdd (the same voltage identified as "Vdd" in FIG. 2) is asserted as reference voltage REF2 to the third stage of VI converter 20.

If the FIG. 3 circuit is implemented as an integrated circuit having a nominal 5.0 volt supply voltage, an internal voltage regulator is preferably used to generate Vdd having a nominal value of 3.3 volts.

Figure 7:
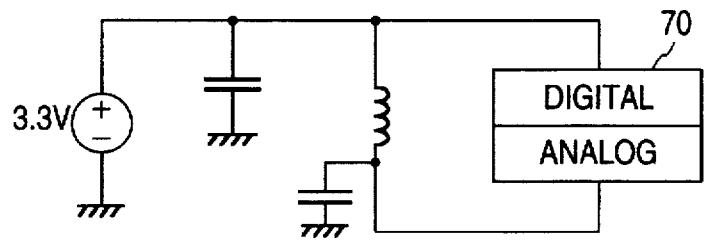
FIG. 7 is a schematic diagram of power supply circuitry for an integrated circuit implementation of the FIG. 3 circuit.

If the FIG. 3 circuit is implemented as an integrated circuit (e.g., integrated circuit 70 of FIG. 7) having a nominal 3.3 volt supply voltage (which is the current norm for sub-micron wafer process technology), the supply voltage can be used as Vdd. In this case, the chip preferably has a supply pin which provides the supply voltage directly to the digital circuitry within the chip (for use as voltage Vdd in FIG. 3) as shown in FIG. 7, in addition to another supply pin which provides the supply voltage to analog circuitry within the chip. As shown in FIG. 7, inductive and capacitive circuitry (the inductor and two capacitors connected as shown) preferably filters the supply voltage applied to the chip.

If VI converter 20 were replaced by the conventional VI converter of FIG. 1, reference voltage REF0 (but not reference voltages REF1 and REF1) would need to be provided to such conventional VI converter. This could be accomplished by a simpler version of circuit 10, which lacks resistors R3 and R4 of the version of circuit 10 shown in FIG. 3.

Voltage source 12 of FIG. 3 asserts voltage V5 to the gates of transistors Q5a, Q5b, Q5c, and Q5d of VI converter 20. Circuit 12 can be implemented as a resistor and an NMOS transistor, with the resistor being connected between a node held at potential Vdd and the drain of the NMOS transistor (the source of the NMOS transistor being connected to ground, and the gate and the drain of the NMOS transistor being connected together).

In the VCO system of FIG. 3, the voltage "OUT" at the output of VI converter 20 determines the control voltages (OUT and OUT') applied to each of the seven cells of oscillator 30 (identified as cells "CELL0-CELL6"). The voltage "OUT" is asserted, as a mirror voltage for the purpose of generating a bias current within each cell of oscillator 30, from converter 20 to a first bias voltage terminal of each of the cells of oscillator 30 (as shown in FIG. 3). The circuit comprising transistors Q6, Q7, Q8, Q9, Q10, Q11, and Q12, op amp 14, and bias source 15 (connected as shown) asserts voltage OUT' (whose level increases in response to increasing level of voltage OUT, and is determined by the level of voltage OUT) from the output terminal of op amp 14 to a second bias voltage terminal of each cell of oscillator 30 as shown. The frequency of the clock signal CLK (and its inverse, CLKB) asserted at the output of oscillator 30 is determined by the control voltages (OUT and OUT'), and is thus determined by the level of voltage OUT.

Figure 6:
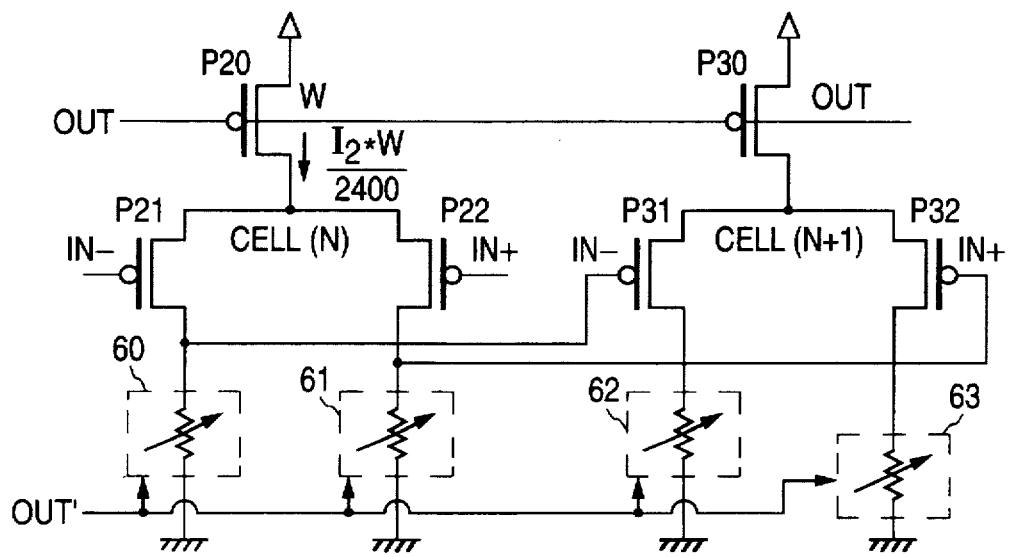
FIG. 6 is a simplified schematic diagram of two cells of an embodiment of circuit 30 of FIG. 3.

Oscillator 30 of FIG. 3 has conventional design. FIG. 6 is a simplified schematic diagram of two cells (e.g., "CELL1" and "CELL2") of an embodiment of circuit 30 of FIG. 3. The first of these cells comprises PMOS transistors P20, P21, and P22, and variable resistors 60 and 61, connected as shown. The second of these cells comprises PMOS transistors P30, P31, and P32, and variable resistors 62 and 63, connected as shown. Voltage OUT is used as a bias voltage which is received at the gate of each of transistors P20 and P21. Voltage OUT' is received at each of variable resistors 60, 61, 62, and 63, and controls the impedance of each of these variable resistors. The current through the channel of transistor P20 is (I2)(w/2400), where I2 is the current labeled "I2" in FIG. 2. "(w/2400)" is the ratio of the widths of the channels of transistor Q2 of FIG. 2 and transistor P20. As OUT' increases, the impedance of each resistor decreases in an effort to keep the quantity (I2)(w/2400)(R) constant, where "R" is the impedance of resistors 60 and 61. If the impedance R did not vary in response to changes in the value of OUT' (and thus in response to changes in the values of OUT and I2), then an increase in current I2 would cause an increase in differential voltage swing but the output frequency of circuit 30 would not increase.

In the desired operating range of the FIG. 3 circuit, the voltage OUT increases faster than linearly in response to a linearly increasing input voltage Vin (over at least part of the operating range), and the frequency of signal CLK increases at linearly or substantially linearly (without saturating) in response to linearly increasing input voltage Vin.

Figure 4:
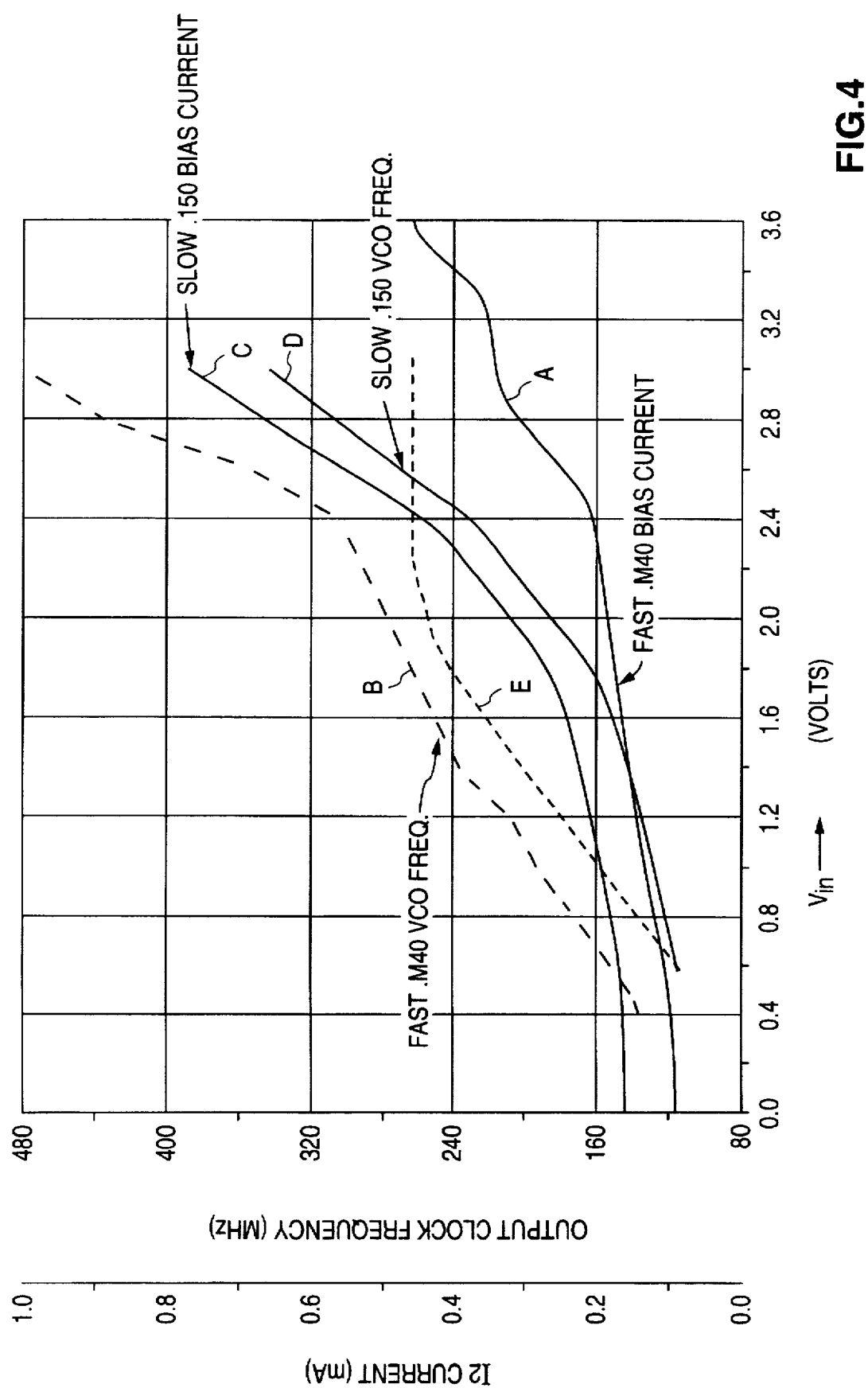
FIG. 4 is a graph of transfer functions of first and second implementations of the FIG. 2 circuit, two implementations of the FIG. 3 circuit (one including the first implementation of FIG. 2; the other including the second implementation of FIG. 2), and a conventional voltage controlled oscillator circuit.

Each of the curves labeled B and D in FIG. 4 is an example of the "output clock frequency-to-input voltage" transfer function of a different implementation of the FIG. 3 system. The curves labeled A and C in FIG. 4 are the "output current-to-input voltage" transfer functions of circuit 20 in these two implementations of the FIG. 3 system (i.e., these transfer functions relate current I2 in FIG. 2 to input voltage Vin). For curves B and D (and below-discussed curve E), distance above the horizontal axis representing increasing output clock frequency according to the vertical frequency axis. For curves A and C, distance above the horizontal axis representing increasing current I2 ([I2a+I2b+I2c+Ibias]=I2, as indicated in FIG. 2) according to the vertical current axis. Although curves A and C thus indicate current I2 as a function in input voltage Vin, they also determine the VI output voltage (voltage "OUT," as indicated in FIG. 2) as a function of input voltage Vin, since the VI output voltage ("OUT") is proportional to current I2.

Curve E of FIG. 4 is an "output clock frequency-to-input voltage" transfer function characteristic of a conventional VCO system (a conventional version of the FIG. 3 system with the FIG. 1 circuit replacing the inventive FIG. 2 implementation of circuit 20).

As apparent from inspection of curve E, such a conventional VCO system is subject to the above-discussed saturating response effect in the operating range from Vin=0.6 volts to Vin=3 volts, in the sense that curve E becomes flattened (its slope decreases until the slope approaches zero) in the upper portion of this operating range (above Vin=1.8 volts). The conventional VCO system has several characteristics which are undesirable for many applications: its "output clock frequency-to-input voltage" transfer function (curve E) has flattened slope above Vin=1.8 volts which limits the maximum output clock frequency attainable with values of input voltage Vin that are available with practical, inexpensive integrated circuitry (the maximum output clock frequency that is practically attainable given the Curve E transfer function is less than 280 MHz); its slope below Vin=1.8 volts is undesirably large; and the maximum output clock frequency attainable with a given range of values of input voltage Vin will vary greatly in response to changing process and operating temperature conditions. Until the present invention, it was not known how to achieve a substantially linear "VCO output clock frequency-to-input voltage" transfer function (or a VCO output clock frequency-to-input voltage transfer function that is not flattened at high input voltages) that has desirable slope over the range of available values of input voltage, and that allows the VCO system to attain a desired maximum output clock frequency (with a VI circuit having a given design, and given a particular range of values of input voltage) despite changes in process and operating temperature conditions.

Curves A, B, C, and D illustrate that the FIG. 3 embodiment of the inventive VCO system is not subject to the undesirable characteristics of the conventional VCO system discussed above with reference to curve E.

Curves C and D characterize an implementation of the FIG. 3 circuit which is an integrated circuit operating under "slow" temperature and process conditions (namely "SLOW.150" conditions under which its transistors' operating junction temperature is 150 degrees Celsius, Vdd is about 3 volts, the transistors have long channels and high threshold voltages, and the resistances are increased by 20% from their nominal values). Curves A and B characterize an implementation of the FIG. 3 circuit which is an integrated circuit operating under "fast" temperature and process conditions (namely "FAST.M40" conditions under which its transistors' operating junction temperature is 40 degrees Celsius, Vdd is about 3.6 volts, the transistors have short channels and low threshold voltages, and the resistances are decreased by 20% from their nominal values).

Curve B (the "output clock frequency-to-input voltage" transfer function of a "fast" implementation of FIG. 3) rises substantially linearly (with positive slope at all portions) from a minimum value of about 133 MHz to above 440 MHz over the full operating range from Vin=0.4 volt to Vin=3 volts (this ignores the break point just below 320 MHz, which is reasonable if the circuit will normally be operated in the range from 133 MHz to 300 MHz). The desirable, substantially constant slope of curve B is achieved because curve A (the "VI output voltage-to-input voltage" transfer function of the VI converter used to control the VCO whose transfer function is curve B) rises nonlinearly (with increasing slope) in the desired operating range from Vin=0.4 volt to Vin=3 volts. The first stage of the VI converter is designed to supply enough bias under "fast" conditions, and the higher order stages are provided so they can come into play under "slow" conditions.

Curve D (the "output clock frequency-to-input voltage" transfer function of a "slow" implementation of FIG. 4) having positive slope (which increases slightly with increasing input voltage) over the full operating range from Vin=0.4 volt to Vin=3 volts, which is desirable for many applications. The desirable slope of curve D is achieved because curve C (the "VI output voltage-to-input voltage" transfer function of the VI converter used to control the VCO whose transfer function is curve D) rises faster than linearly in the desired operating range from Vin=0.4 volt to Vin=3 volts.

Note, under "Fast" conditions, the VCO gets less bias current (than under "Slow" conditions), the three differential pairs (Q3a, Q4a, R1a, R2a, and Q3b, Q4b, R1b, R2b, and Q3c, Q4c, R1c, R2c) are more ideal (than under "Slow" conditions) with lower threshold voltages and lower resistances. As the differential pairs approach ideal operation, the first stage (which receives voltage REF0) will contribute more current to the summed current I2 than will the other stages. The third stage (which receives voltage REF2) will not contribute until Vin is very close to Vdd.

The VCO system of FIG. 3 attains a useful maximum output clock frequency (e.g., 300 MHz or 320 MHz) over the input voltage range from Vin=0.4 volt to Vin=3.0 volts despite significant changes in process and operating temperature conditions (e.g., both the "fast" implementation of this VCO system characterized by curve B and the "slow" implementation of this VCO system characterized by curve D have this property).

If the FIG. 3 circuit is implemented as an integrated circuit and operates under "slow" temperature and process conditions (e.g., "SLOW.150" conditions as indicated in FIG. 4), a gain (average slope of the "clock output frequency-to-input voltage" transfer function) in the operating range (from 150 MHz to 300 MHz) of about 87 MHz/volt can be achieved. If the FIG. 3 circuit is implemented as an integrated circuit and operates under "fast" temperature and process conditions (e.g., "FAST.M40" conditions as indicated in FIG. 4), a gain in the desired operating range of 78 MHz/volt can be achieved. These gain values compare favorably with the gains of 100 MHz/volt and 150 MHz/volt that can be achieved by implementing the VCO system with circuit 20 implemented as the conventional FIG. 1 circuit (with reference voltage REF0=Vdd/2 asserted to the gate of Q3 rather than the inventive circuit of FIG. 2), under "slow" and "fast" temperature and process conditions, respectively.

Conventional versions of the VCO system of FIG. 3 (e.g., a version of FIG. 3 with the FIG. 1 circuit replacing the FIG. 2 implementation of circuit 20) are subject to the saturating response problem (flat slope of the "output clock frequency-to-input voltage" transfer function at high output clock frequencies in the desired output clock frequency range, as in curve E of FIG. 4). This problem is not unique to that particular VCO design. For example, VCOs having another conventional design that includes a ring oscillator (built up with CMOS inverters with current sources coupled to the sources of the PMOS and NMOS transistors of each inverter), and a conventional one-stage voltage-to-current converter, are also subject to the saturating response problem. The problem can be eliminated by using the inventive multi-stage voltage-to-current converter in place of a conventional one-stage voltage-to-current converter in such a ring oscillator VCO circuit (or in other conventional VCO systems that are subject to the problem).

The inventive VCO system of FIG. 3 is designed to produce output voltage CLK having any desired frequency in the range from 150 megahertz to 300 megahertz, over process, temperature, and supply voltage tolerances. By implementing VI converter 20 to be the inventive FIG. 2 circuit (rather than the conventional FIG. 1 circuit), the FIG. 3 system achieves lower worst case gain (worst case slope of its "output clock frequency-to-input voltage" transfer function) and increased lock voltage range. The inventive multi-stage VI converter has more degrees of freedom than the conventional one-stage circuit of FIG. 1 (in the sense that particular values of the parameters its components can be chosen to achieve any of a wide variety of operating characteristics), the output clock frequency-to-input voltage transfer function of the FIG. 3 circuit can be tailored to suit any of a wide range of needs. Among the parameters of the inventive VI converter that can be chosen to accomplish this tailoring are the number of stages of the VI converter (e.g., three as in FIG. 2, or two, or more than three), the reference voltage (e.g., REF0, REF1, and REF2) asserted to each stage, the resistances (e.g., R1a, R2a, R1b, R2b, R1c, and R2c) for each stage, and the tail current (e.g., currents I5a, I5b, and I5c) for each stage.

It should be understood that various alternatives to the structures described herein may be employed in practicing the present invention. It is intended that the following claims define the invention and that structures within the scope of these claims and their equivalents be covered thereby.

What is claimed is:

1. A multistage voltage converter for producing, at an output node in response to an input voltage, an output voltage useful for controlling a voltage controlled oscillator, said multistage voltage converter comprising:

a first differential amplifier stage, having an input coupled to receive the input voltage, a reference node coupled to receive a first reference voltage, and a first output coupled to the output node, and being configured to draw a first component current from the output node and to sink a first tail current to ground; and a second differential amplifier stage coupled between the input node and the output node in parallel with the first differential amplifier, having a second reference node coupled to receive a second reference voltage, and being configured to draw a second component current from the output node and to sink a second tail current to ground, where the first component current is determined by the first reference voltage and the input voltage, the second component current is determined by the second reference voltage and the input voltage, and a nonlinear function of the input voltage relates the output voltage to said input voltage.

2. The multistage voltage converter of claim 1, wherein the first component current is related to the input voltage by a nondecreasing function of said input voltage, the second component current is related to the input voltage by a second nondecreasing function of said input voltage, and the output voltage is related to the sum of the first component current and the second component current by a third nondecreasing function of said sum.

3. The multistage voltage converter of claim 1, also including:

a third differential amplifier stage coupled between the input node and the output node in parallel with the first differential amplifier, having a third reference node coupled to receive a third reference voltage, and being configured to draw a third component current from the output node and to sink a third tail current to ground, where the third component current is determined by the third reference voltage and the input voltage, and the output voltage is related to the sum of the first component current, the second component current, and the third component current by a nondecreasing function of said sum.

4. The multistage voltage converter of claim 3, wherein the first component current is related to the input voltage by a second nondecreasing function of said input voltage, the second component current is related to the input voltage by a third nondecreasing function of said input voltage, and the third component current is related to the input voltage by a fourth nondecreasing function of said input voltage.

5. The multistage voltage converter of claim 1, also including:

a third differential amplifier stage coupled between the input node and the output node in parallel with the first differential amplifier, having a third reference node coupled to receive a third reference voltage, and being configured to draw a third component current from the output node and to sink a third tail current to ground, where the third component current is determined by the third reference voltage and the input voltage, and the output voltage is related to the sum of the first component current, the second component current, and the third component current by a nonincreasing function of said sum.

6. The multistage voltage converter of claim 5, wherein the first component current is related to the input voltage by a second nonincreasing function of said input voltage, the second component current is related to the input voltage by a third nonincreasing function of said input voltage, and the third component current is related to the input voltage by a fourth nonincreasing function of said input voltage.

7. The multistage voltage converter of claim 1, also including:

bias voltage circuitry coupled to the output node and configured to hold the output node at a potential other than ground potential when the input node is at said ground potential.

8. A multistage voltage converter for producing, at an output node in response to an input voltage, an output voltage useful for controlling a voltage controlled oscillator, said multistage voltage converter comprising:

a first differential amplifier stage having a first branch including a first MOSFET transistor whose gate is coupled to receive a first reference voltage, a second branch including a second MOSFET transistor whose gate is coupled to receive the input voltage, and a first current sink circuit, where the first branch is coupled between a first node and a second node so that a first current can flow through the channel of the first MOSFET transistor from the first node to the second node, the second branch is coupled between the output node and the second node so that a second current can flow through the channel of the second MOSFET transistor from the output node to the second node, and the first current sink circuit is coupled to the second node and configured to sink a first tail current from the second node; and a second differential amplifier stage having a third branch including a third MOSFET transistor whose gate is coupled to receive a second reference voltage, a fourth branch including a fourth MOSFET transistor whose gate is coupled to receive the input voltage, and a second current sink circuit, where the third branch is coupled between a third node and a fourth node so that a third current can flow through the channel of the third MOSFET transistor from the third node to the fourth node, the fourth branch is coupled between the output node and the fourth node so that a fourth current can flow through the channel of the fourth MOSFET transistor from the output node to the fourth node, the second current sink circuit is coupled to the fourth node and configured to sink a second tail current from the second node, the second current is determined by the first reference voltage and the input voltage, the fourth current is determined by the second reference voltage and the input voltage, and a nonlinear function of the input voltage relates the output voltage to said input voltage.

9. The multistage voltage converter of claim 8, wherein the second current is related to the input voltage by a nondecreasing function of said input voltage, the fourth current is related to the input voltage by a second nondecreasing function of said input voltage, and the output voltage is related to the sum of the second current and the fourth current by a third nondecreasing function of said sum.

10. The multistage voltage converter of claim 8, also including:

a third differential amplifier stage having a fifth branch including a fifth MOSFET transistor whose gate is coupled to receive a third reference voltage, a sixth branch including a sixth MOSFET transistor whose gate is coupled to receive the input voltage, and a third current sink circuit, where the fifth branch is coupled between a fifth node and a sixth node so that a fifth current can flow through the channel of the fifth MOSFET transistor from the fifth node to the sixth node, the sixth branch is coupled between the output node and the sixth node so that a sixth current can flow through the channel of the sixth MOSFET transistor from the output node to the sixth node, the third current sink circuit is coupled to the sixth node and configured to sink a third tail current from the sixth node, the sixth current is determined by the third reference voltage and the input voltage, and the output voltage is related to the sum of the second current, the fourth current, and the sixth current by a nondecreasing function of said sum.

11. The multistage voltage converter of claim 10, wherein the second current is related to the input voltage by a second nondecreasing function of said input voltage, the fourth current is related to the input voltage by a third nondecreasing function of said input voltage, and the sixth current is related to the input voltage by a fourth nondecreasing function of said input voltage.

12. The multistage voltage converter of claim 8, also including:

a third differential amplifier stage having a fifth branch including a fifth MOSFET transistor whose gate is coupled to receive a third reference voltage, a sixth branch including a sixth MOSFET transistor whose gate is coupled to receive the input voltage, and a third current sink circuit, where the fifth branch is coupled between a fifth node and a sixth node so that a fifth current can flow through the channel of the fifth MOSFET transistor from the fifth node to the sixth node, the sixth branch is coupled between the output node and the sixth node so that a sixth current can flow through the channel of the sixth MOSFET transistor from the output node to the sixth node, the third current sink circuit is coupled to the sixth node and configured to sink a third tail current from the sixth node, the sixth current is determined by the third reference voltage and the input voltage;

first circuitry configured to provide a supply voltage to the first node, the third node and the fifth node;

second circuitry configured to provide a second supply voltage, at least substantially equal to the supply voltage, to the second node, the fourth node and the sixth node, and wherein the third reference voltage has a value Vdd, where the value Vdd is at least substantially equal to the supply voltage, the second reference voltage is at least substantially equal to (¾)(vdd), and the first reference voltage is at least substantially equal to Vdd/2.

13. The multistage voltage converter of claim 12, wherein the supply voltage is substantially equal to the second supply voltage.

14. The multistage voltage converter of claim 8, also including:

a third differential amplifier stage having a fifth branch including a fifth MOSFET transistor whose gate is coupled to receive a third reference voltage, a sixth branch including a sixth MOSFET transistor whose gate is coupled to receive the input voltage, and a third current sink circuit, where the fifth branch is coupled between a fifth node and a sixth node so that a fifth current can flow through the channel of the fifth MOSFET transistor from the fifth node to the sixth node, the sixth branch is coupled between the output node and the sixth node so that a sixth current can flow through the channel of the sixth MOSFET transistor from the output node to the sixth node, the third current sink circuit is coupled to the sixth node and configured to sink a third tail current from the sixth node, the sixth current is determined by the third reference voltage and the input voltage, and the output voltage is related to the sum of the second current, the fourth current, and the sixth current by a nonincreasing function of said sum.

15. The multistage voltage converter of claim 14, wherein the first component current is related to the input voltage by a second nonincreasing function of said input voltage, the second component current is related to the input voltage by a third nonincreasing function of said input voltage, and the third component current is related to the input voltage by a fourth nonincreasing function of said input voltage.

16. The multistage voltage converter of claim 8, also including:

bias voltage circuitry coupled to the output node and configured to hold the output node at a potential other than ground potential when the input node is at said ground potential.

17. The multistage voltage converter of claim 16, wherein the bias voltage circuitry comprises:

a resistor having a first end connected to the output node and a second end; and a MOSFET transistor having a first channel terminal connected to the second end of the resistor, a second channel terminal connected to ground, and a gate coupled to receive a control voltage.

18. The multistage voltage converter of claim 8, wherein the first branch includes a first resistor coupled between the channel of the first MOSFET transistor and the second node, the second branch includes a second resistor coupled between the channel of the second MOSFET transistor and the second node, the third branch includes a third resistor coupled between the channel of the third MOSFET transistor and the fourth node, and the fourth branch includes a fourth resistor coupled between the channel of the fourth MOSFET transistor and the fourth node.

19. The multistage voltage converter of claim 8, also including:

a third differential amplifier stage having a fifth branch including a fifth MOSFET transistor whose gate is coupled to receive a third reference voltage, a sixth branch including a sixth MOSFET transistor whose gate is coupled to receive the input voltage, and a third current sink circuit, where the fifth branch is coupled between a fifth node and a sixth node so that a fifth current can flow through the channel of the fifth MOSFET transistor from the fifth node to the sixth node, the sixth branch is coupled between the output node and the sixth node so that a sixth current can flow through the channel of the sixth MOSFET transistor from the output node to the sixth node, the third current sink circuit is coupled to the sixth node and configured to sink a third tail current from the sixth node, the sixth current is determined by the third reference voltage and the input voltage;

first circuitry configured to provide a supply voltage to the first node, the third node and the fifth node; and second circuitry configured to provide a second supply voltage, at least substantially equal to the supply voltage, to the second node, the fourth node and the sixth node, and wherein the first branch includes a first resistor coupled between the channel of the first MOSFET transistor and the second node, the second branch includes a second resistor coupled between the channel of the second MOSFET transistor and the second node, the third branch includes a third resistor coupled between the channel of the third MOSFET transistor and the fourth node, the fourth branch includes a fourth resistor coupled between the channel of the fourth MOSFET transistor and the fourth node, the fifth branch includes a fifth resistor coupled between the channel of the fifth MOSFET transistor and the sixth node, and the sixth branch includes a sixth resistor coupled between the channel of the sixth MOSFET transistor and the sixth node, the third reference voltage has a value Vdd, where the value Vdd is at least substantially equal to the supply voltage, the second reference voltage is at least substantially equal to (¾)(Vdd), and the first reference voltage is at least substantially equal to Vdd/2, and each of the fifth resistor and the sixth resistor has a resistance R, each of the third resistor and the fourth resistor has a resistance at least substantially equal to 2R, and each of the first resistor and the second resistor has a resistance at least substantially equal to 16R.

20. A voltage-controlled oscillator system, including:

a multistage voltage converter for producing an output voltage at an output node in response to an input voltage asserted to an input node, wherein the multistage voltage converter includes at least two differential amplifier stages connected in parallel between the input node and the output node, a first one of the stages has a second node coupled to receive a first reference voltage, a second one of the stages has a third node coupled to receive a second reference voltage, the first one of the stages is configured to draw a first component current from the output node and to sink a first tail current to ground, the second one of the stages is configured to draw a second component current from the output node and to sink a second tail current to ground, the first component current is determined by the first reference voltage and the input voltage, the second component current is determined by the second reference voltage and the input voltage, and the output voltage is related to the input voltage by a nonlinear function of said input voltage; and a voltage-controlled oscillator having a control input coupled to the output node so as to receive the output voltage, and including circuitry configured to generate a clock signal having frequency determined by the output voltage.

21. The system of claim 20, wherein the frequency of the clock signal is related to the input voltage by a transfer function, and the transfer function is at least substantially linear over a desired clock frequency range and has a desired average slope in said clock frequency range.

22. The system of claim 20, wherein the multistage voltage converter includes:

bias voltage circuitry coupled to the output node and configured to hold the output node at a potential other than ground potential when the input node is at said ground potential.

23. The system of claim 20, wherein the multistage voltage converter has three differential amplifier stages connected in parallel between the input node and the output node.

24. The system of claim 23, wherein the multistage voltage converter includes:

a first differential amplifier stage having a first branch including a first MOSFET transistor whose gate is coupled to receive a first reference voltage, a second branch including a second MOSFET transistor whose gate is coupled to receive the input voltage, and a first current sink circuit, where the first branch is coupled between a first node and a second node so that a second current can flow through the channel of the first MOSFET transistor from the first node to the second node, the second branch is coupled between the output node and the second node so that the first component current can flow through the channel of the second MOSFET transistor from the output node to the second node, and the first current sink circuit is coupled to the second node and configured to sink a first tail current from the second node;

a second differential amplifier stage having a third branch including a third MOSFET transistor whose gate is coupled to receive a second reference voltage, a fourth branch including a fourth MOSFET transistor whose gate is coupled to receive the input voltage, and a second current sink circuit, where the third branch is coupled between a third node and a fourth node so that a third current can flow through the channel of the third MOSFET transistor from the third node to the fourth node, the fourth branch is coupled between the output node and the fourth node so that the second component current can flow through the channel of the fourth MOSFET transistor from the output node to the fourth node, the second current sink circuit is coupled to the fourth node and configured to sink a second tail current from the second node; and a third differential amplifier stage having a fifth branch including a fifth MOSFET transistor whose gate is coupled to receive a third reference voltage, a sixth branch including a sixth MOSFET transistor whose gate is coupled to receive the input voltage, and a third current sink circuit, where the fifth branch is coupled between a fifth node and a sixth node so that a fourth current can flow through the channel of the fifth MOSFET transistor from the fifth node to the sixth node, the sixth branch is coupled between the output node and the sixth node so that a third component current can flow through the channel of the sixth MOSFET transistor from the output node to the sixth node, the third current sink circuit is coupled to the sixth node and configured to sink a third tail current from the sixth node, the first component current is determined by the first reference voltage and the input voltage, the second component current is determined by the second reference voltage and the input voltage, the third component current is determined by the third reference voltage and the input voltage, and the output voltage is related to the input voltage by a nonlinear function of said input voltage.

25. The system of claim 24, wherein the first component current is related to the input voltage by a nondecreasing function of said input voltage, the second component current is related to the input voltage by a second nondecreasing function of said input voltage, the third component current is related to the input voltage by a third nondecreasing function of said input voltage, and the output voltage is related to the sum of the first component current, the second component current, and the third component current by a third nondecreasing function of said sum.

* * * * *